US007013012B2

(12) United States Patent
Lo

(10) Patent No.: US 7,013,012 B2
(45) Date of Patent: Mar. 14, 2006

(54) METHOD FOR PROCESSING SOUND EFFECTS IN A NOTEBOOK COMPUTER

(75) Inventor: Li-Chun Lo, Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 462 days.

(21) Appl. No.: 10/329,957

(22) Filed: Dec. 26, 2002

(65) Prior Publication Data

US 2004/0057590 A1 Mar. 25, 2004

(30) Foreign Application Priority Data

Sep. 20, 2002 (TW) ................................ 91121699 A

(51) Int. Cl.

*H04R 5/02* (2006.01)
*H04R 3/00* (2006.01)
*H03G 3/00* (2006.01)
*G06F 17/00* (2006.01)

(52) U.S. Cl. ........................ 381/307; 381/306; 381/81; 381/61; 700/94

(58) Field of Classification Search ................ 381/307, 381/61, 67, 81, 306; 700/94

See application file for complete search history.

(56) References Cited

U.S. PATENT DOCUMENTS 6,885,900 B1 * 4/2005 Rybicki et al. ............... 700/94

OTHER PUBLICATIONS

C-Media Electronics. C-Media XeaR 3D Sound Solution. CMI8738 4/6-Channel PCI Audio Single Chip. User Manual. Rev. 2.1. May 21, 2002.*

CMI9739/CMI9739A Six Chanell Audio Codec. Version 1.3. May 2002.*

* cited by examiner

*Primary Examiner*—Vivian Chin
*Assistant Examiner*—Devona E. Faulk
(74) *Attorney, Agent, or Firm*—Thomas, Kayden, Horstemeyer & Risley

(57) ABSTRACT

A method for processing sound effects in a notebook computer to support several sound effect modes. First, the method determines whether or not the pre-assigned sound effect mode is the stereo mode, assigns a line-out jack as a dual-channel output terminal and assigns a Mic-in jack as a sound-effect input terminal if the sound effect mode is the stereo mode. If the sound effect mode is not the stereo mode, a 4-channel or 5.1 -channel determination is made. If the sound effect mode is the 4-channel mode, the Mic-in jack is assigned as an output terminal for front sound effects, and the line-out jack is assigned an output terminal for surround sound effects. If the sound effect mode is the 5.1-channel mode, the Mic-in jack is assigned as an output terminal for woof and center sound effects, the line-out jack is assigned as an output terminal for surround sound effects, and the build-in speaker is assigned as an output for front sound effects.

13 Claims, 3 Drawing Sheets

METHOD FOR PROCESSING SOUND EFFECTS IN A NOTEBOOK COMPUTER

This application incorporates by reference of Taiwan application Serial No. 091121699, filed Sep. 20, 2002.

BACKGROUND OF THE INVENTION

1. Field of the Invention

The invention relates to a method for processing sound effects, and more particularly to a method for processing sound effects in a notebook computer.

2. Description of the Related Art

The need of Multimedia applications is the important trigger for the advance of the computer industry. The performance of video and sound effects in VCDs, DVDs or computer games have been continuously developed and renovated, which implies the arrival of the multimedia age.

The surround sound field, which may only be experienced in the listening room previously, is now also available even in the study room because of the popularization of personal computers (PCs). Commercial sound cards as well as build-in sound effect chips on mainboards support the 5.1-channel output. Therefore, PC users may spend less money to enjoy the comfort and convenience brought by the technology. However, notebook computer owners are not so lucky, at least before the disclosure of the invention. They do not have the chance to enjoy the convenience because the multimedia functions of the notebook computers are limited to the stereo sound output of dual channels and may only satisfy the basic requirements of sound effects.

Nowadays, high-quality multimedia effects are in great demand. But notebook computers used to have inferior multimedia effects and are commonly regarded as the unsuitable platforms for multimedia applications. Thus, generating the surround sound fields of 4 channels or 5.1 channels in the notebook computers becomes a hot issue in the industry.

SUMMARY OF THE INVENTION

It is therefore an object of the invention to provide a method for processing sound effects in notebook computers so as to create surround sound effects.

The invention achieves the above-mentioned object by providing a method for processing sound effects in a notebook computer, the method being described as follows.

First, the method determines whether or not the pre-assigned sound effect mode is the stereo mode, assigns a line-out jack as a dual-channel output terminal and assigns a Mic-in jack as a sound-effect input terminal if the sound effect mode is the stereo mode. If the sound effect mode is not the stereo mode, 4-channel or 5.1-channel determination is made. If the sound effect mode is the 4-channel mode, the Mic-in jack is assigned as an output terminal for front sound effects, and the line-out jack is assigned an output terminal for surround sound effects. If the sound effect mode is the 5.1-channel mode, the Mic-in jack is assigned as an output terminal for woof and center sound effects, the line-out jack is assigned as an output terminal for surround sound effects, and the build-in speaker is assigned as an output for front sound effects.

On the other hand, both of the Mic-in jack and line-out jack may support the auto-detection function so as to facilitate the operation. For example, the line-out jack may auto-detect whether or not a speaker is inserted. If the external speaker is inserted into the line-out jack when the sound effect mode is set to be the stereo or 4-channel mode, the build-in speaker may be disabled automatically and the external speaker may be assigned as an output device for sound effects. In addition, the Mic-in jack may determine the type of the inserted sound effect device. For example, the inserted sound effect device may be determined as a microphone or speaker. If the external speaker is inserted into the Mic-in jack when the sound effect mode is set to the 4-channel mode, the build-in speaker may be disabled automatically.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
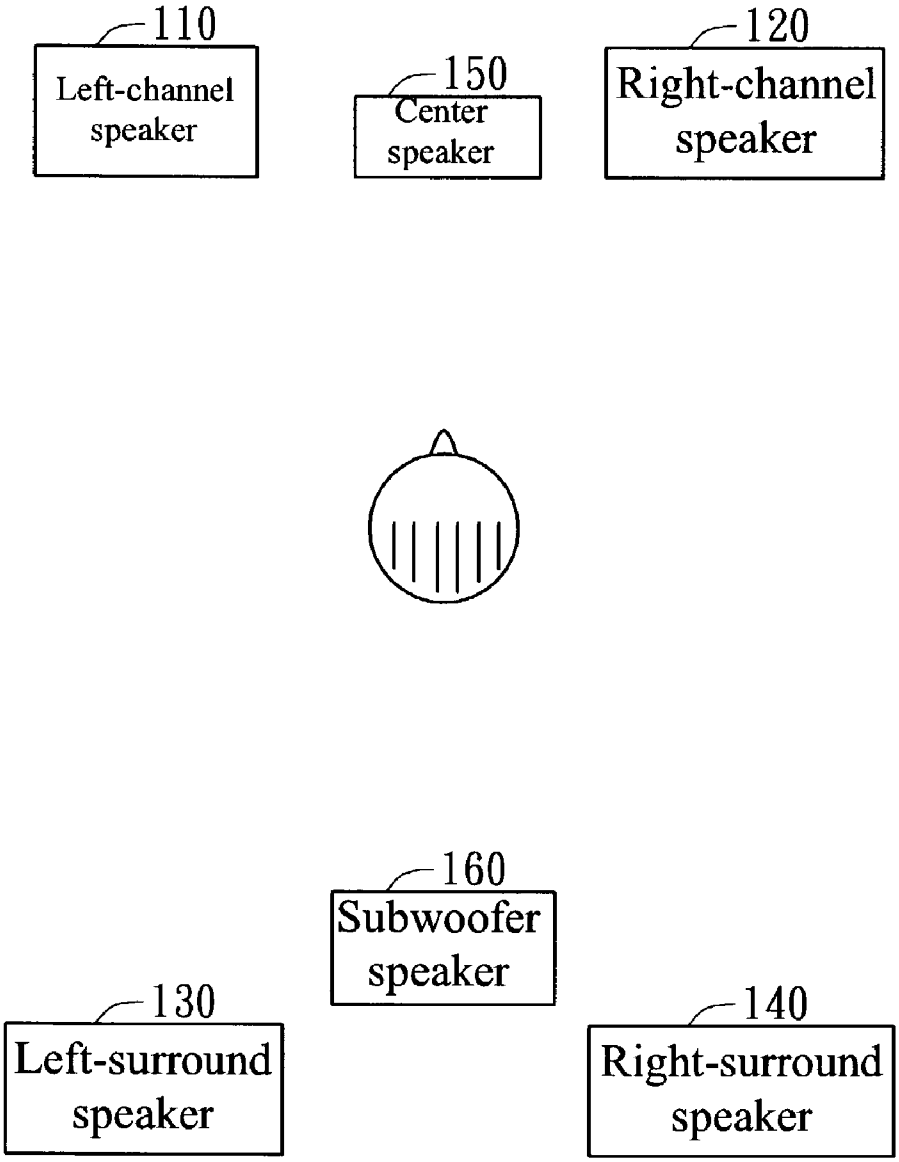
FIG. 1 is a schematic illustration showing compositions of a surround sound field.

Please refer to FIG. 1, which is a schematic illustration showing compositions of a surround sound field. If the listener sits in the middle, a left-channel speaker 110 and a right-channel speaker 120 creating the front sound effects are arranged at the left-front side and right-front side of the listener, respectively. In addition, a left surround speaker 130 and a right surround speaker 140 creating the surround sound effects are arranged at the left-rear side and right-rear side of the listener, respectively. The above-mentioned arrangement is called the 4-channel arrangement. If a center speaker 150 is added between the left-channel speaker and the right-channel speaker in conjunction with a subwoofer speaker 160, the 5.1-channel arrangement is thus created. Because the woofs are non-directional, the position of the subwoofer speaker 160 is not limited and the subwoofer speaker 160 may be arbitrarily arranged according to the listener's preference. The basic sound field is the stereo or dual-channel output, which is created by the left-channel speaker 110 and the right-channel speaker 120. Of course, the basic sound field can satisfy users with less demand in sound effects.

Figure 2:
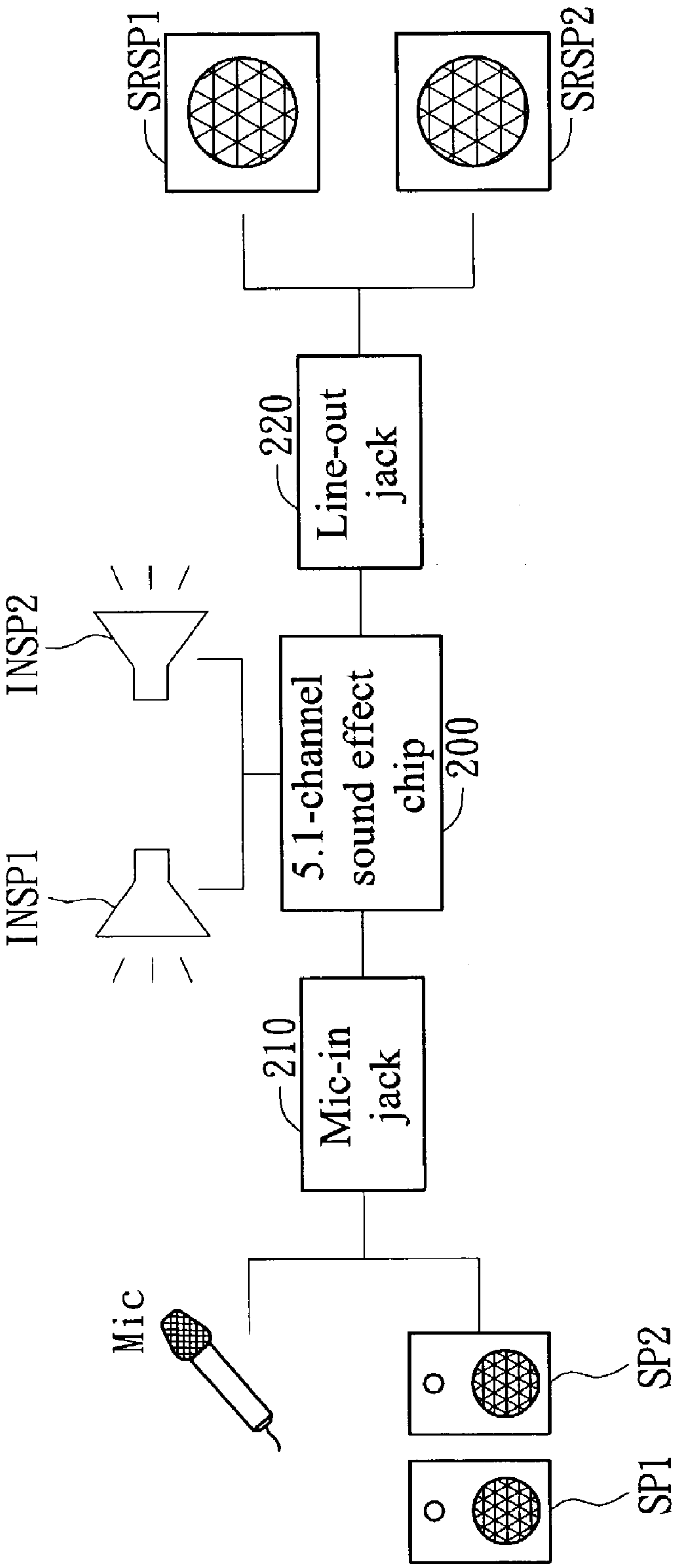
FIG. 2 is a schematic illustration showing compositions of a surround sound effect according to a preferred embodiment of the invention.

Please refer to FIG. 2, which is a schematic illustration showing compositions of a surround sound effect according to a preferred embodiment of the invention. The architecture of FIG. 2 is suitable for the notebook computers. In terms of the sound effect jack, the Mic-in jack and line-out jack are standard equipments in the notebook computer. Thus, the embodiment of the invention may create the simple dual-channel sound effect, 4-channel, or 5.1-channel surround sound effect using the 5.1-channel sound effect chip 200 in conjunction with the Mic-in jack 210 and the line-out jack 220.

The 5.1-channel sound effect chip 200 possesses several sound effect processing abilities so as to support the functions of the stereo, 4-channel and 5.1-channel modes. When the sound effect mode of the system is set to be the stereo mode, the line-out jack 220 may be assigned as a dual-channel output terminal to which speakers SRSP1 and SRSP2 are connected as a left-channel speaker and a right-channel speaker, respectively, thereby implementing the dual-channel output. At this time, the Mic-in jack 210 is assigned as a sound-effect input terminal for receiving the audio signal from the microphone Mic.

It should be noted that the line-out jack 220 might possess the auto-detection function to auto-detect whether or not an external speaker is connected thereto. When the sound effect mode is set to be the stereo mode, the line-out jack 220 may detect the presence of connections between other devices and the line-out jack 220. If no device is connected to the line-out jack 220, the build-in speakers INSP1 and INSP2 serve as output devices for stereo sound effects. If the external speakers SRSP1 and SRSP2 are connected to the line-out jack 220 and thus to the computer system, the build-in speakers INSP1 and INSP2 are automatically disabled, and the external speakers SRSP1 and SRSP2 serve as the output devices for stereo sound effects.

When the sound effect mode of the system is set to be the 4-channel mode, the Mic-in jack 210 may be assigned as an output terminal for front sound effects to which the external speakers SP1 and SP2 are connected as a left-channel speaker and a right-channel speaker, respectively. Meanwhile, the line-out jack 220 is assigned as an output terminal of surround sound effects to which the external speakers SRSP1 and SRSP2 are connected as a left surround speaker and a right surround speaker so as to implement the 4-channel output.

The Mic-in jack 210 is similar to the line-out jack 220 and also possesses the auto-detection function to detect the type of the inserted sound effect device. For example, the inserted sound effect device may be detected as a microphone or speaker. When the sound effect mode is set to be the 4-channel mode, the external speakers SP1 and SP2 may be inserted into the Mic-in jack 210 to automatically disable the build-in speakers INSP1 and INSP2. Meanwhile, the external speakers SP1 and SP2 serve as the output devices for the front sound effects, while the external speakers SRSP1 and SRSP2 connecting to the line-out jack 220 serve as the output devices for the surround sound effects.

When the sound effect mode of the system is set to be the 5.1-channel mode, the build-in speakers INSP1 and INSP2 of the notebook computer may serve as a left-channel speaker and a right-channel speaker, respectively. In addition, the Mic-in jack 210 is assigned as an output terminal for the woof and center sound effects, and the speakers SP1 and SP2 serve as a subwoofer speaker and a center speaker, respectively. In addition, the line-out jack 220 is assigned as an output terminal for surround sound effects, and the speakers SRSP1 and SRSP2 may serve as a left surround speaker and a right surround speaker, respectively, to implement the 5.1-channel output.

As mentioned above, both of the Mic-in jack 210 and the line-out jack 220 posses the auto-detection functions. When the sound effect mode is set to be the 5.1-channel mode, the build-in speakers INSP1 and INSP2 may serve as the output devices for stereo sound effects, the external speakers SP1 and SP2 connecting to the Mic-in jack 210 may serve as the output devices for the woof and center sound effects, and the external speakers SRSP1 and SRSP2 connecting to the line-out jack 220 may serve as the output devices for the surround sound effects.

It should be noted that the sound effect mode of the stereo, 4-channel or 5.1-channel might be set using an application program under an operation system in the notebook computer. Alternatively, the sound effect mode may be set by operating the button(s) on the control panel of the notebook computer.

Figure 3:
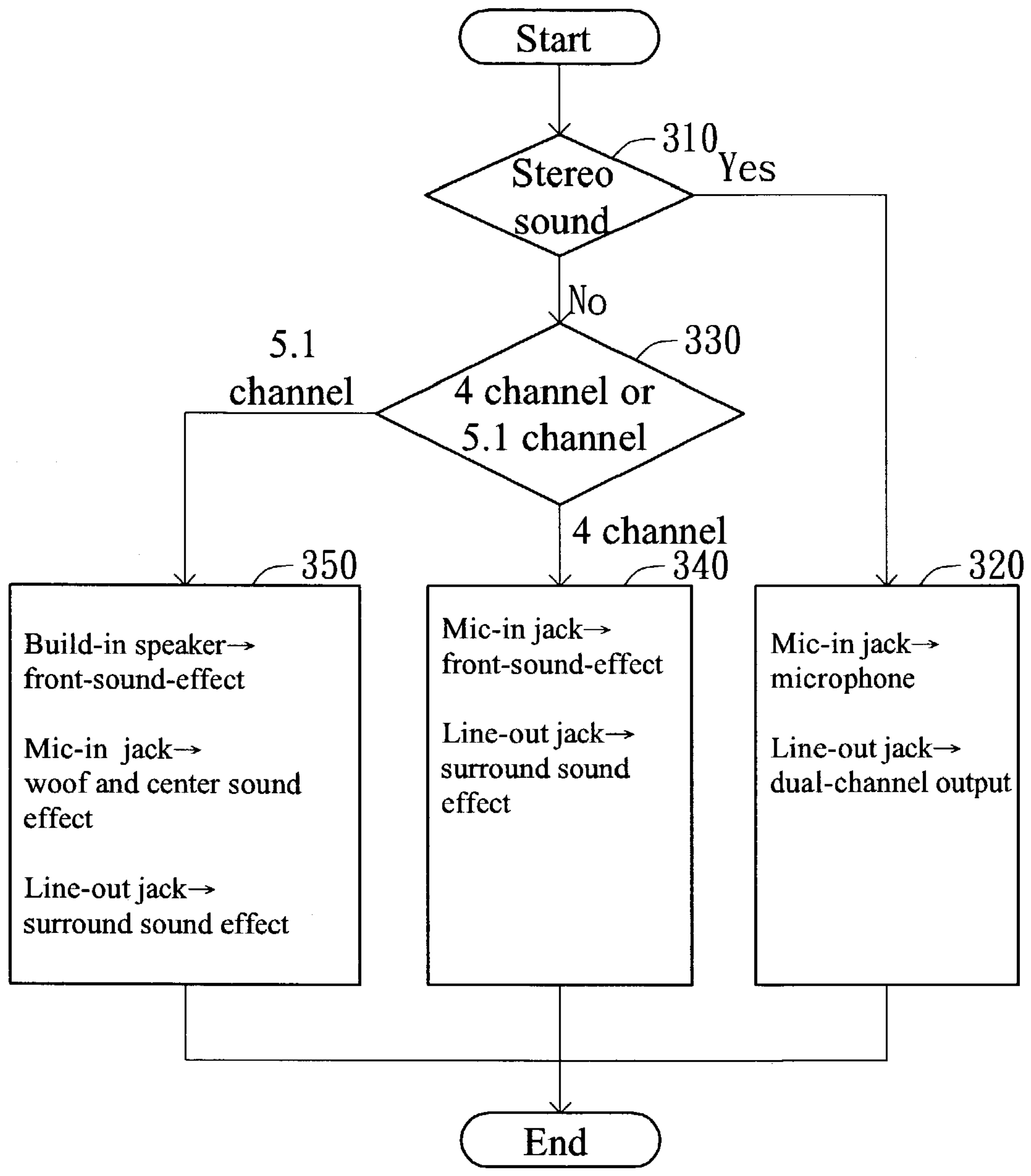
FIG. 3 is a flow chart showing the method for processing sound effects in a notebook computer according to a preferred embodiment of the invention.

Please refer to FIG. 3, which is a flow chart showing the method for processing sound effects in a notebook computer according to a preferred embodiment of the invention. First, Step 310 is executed to determine whether or not the pre-assigned sound effect mode is the stereo mode. If yes, the line-out jack 220 is assigned as a dual-channel output terminal and the Mic-in jack 210 is assigned as a sound-effect input terminal (Step 320). If not, Step 330 may determine whether or not the sound effect mode is a 4-channel or 5.1-channel mode. If the sound effect mode is a 4-channel mode, the Mic-in jack 210 is assigned as an output terminal for front sound effects, and the line-out jack 220 is assigned as an output terminal for surround sound effects (Step 340). If the sound effect mode is the 5.1-channel mode, the Mic-in jack 210 is assigned as the output terminal for the woof and center sound effects, the line-out jack 220 is assigned as an output terminal for surround sound effects, and the build-in speakers INSP1 and INSP2 are assigned as the output devices for the front sound effects.

On the other hand, both of the Mic-in jack 210 and the line-out jack 220 may support the auto-detection function to facilitate the operation. More specifically, the line-out jack 220 may auto-detect whether or not a speaker is inserted. If the sound effect mode is set to be the stereo mode or the 4-channel mode and the speakers are inserted into the line-out jack 220, the build-in speakers INSP1 and INSP2 may be automatically disabled. In addition, the Mic-in jack 210 may auto-detect the type of the inserted sound effect device. For example, the inserted sound effect device may be detected as a microphone or speaker. If speakers are inserted into the Mic-in jack 210 when the sound effect mode is set to be the 4-channel mode, the build-in speakers INSP1 and INSP2 may be disabled automatically.

The method for processing sound effects in a notebook computer as disclosed in the above-mentioned embodiment of the invention may implement the sound field effects of stereo, 4-channel or 5.1-channel mode using the build-in speakers, Mic-in jack and the line-out port, which have already existed in the notebook computer. Consequently, the sound effect of the notebook computer will be highly improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for processing sound effects in a notebook computer and for assigning an output channel according to a sound effect mode, the notebook computer including a 5.1-channel sound effect chip, build-in speakers, a Mic-in port and a line-out port, the method comprising the steps of:

a) determining whether or not the sound effect mode is a stereo mode, if yes, assigning the line-out jack as a dual-channel output terminal and assigning the Mic-in jack as a sound-effect input terminal, otherwise, executing step (b);

b) determining whether or not the sound effect mode is a 4-channel mode or a 5.1-channel mode, if the sound effect mode is the 4-channel mode, executing step (c) and if the sound effect mode is a 5.1-channel mode, executing step (d);

c) assigning the Mic-in jack as an output terminal for front sound effects and the line-out jack as an output terminal for surround sound effects; and d) assigning the Mic-in jack as an output terminal for woof and center sound effects, the line-out jack as an output terminal for surround sound effects, and the build-in speakers as an output for front sound effects.

2. The method according to claim 1, wherein the sound effect mode is set using a control panel of the notebook computer.

3. The method according to claim 1, wherein the sound effect mode is set using an application program under an operation system in the notebook computer.

4. The method according to claim 1, wherein the line-out jack supports an auto-detection function to disable the build-in speakers.

5. The method according to claim 1, wherein the Mic-in jack supports an auto-detection function to determine a type of an inserted sound effect device to disable the build-in speakers.

6. A method for processing sound effects in a notebook computer and for assigning an output channel according to a sound effect mode, the notebook computer including a 5.1-channel sound effect chip, build-in speakers, a Mic-in jack and a line-out port, the method comprising the steps of:

a) determining whether or not the sound effect mode is a stereo mode, if yes, assigning the build-in speakers as a dual-channel output terminal and the Mic-in jack as a sound-effect input terminal, and otherwise, executing step (b);

b) determining whether or not the sound effect mode is a 4-channel mode or a 5.1-channel mode, if the sound effect mode is the 4-channel mode, executing step (c), and if the sound effect mode is the 5.1-channel mode, executing step (d);

c) assigning the Mic-in jack as an output terminal for front sound effects and the line-out jack as an output terminal for surround sound effects; and d) assigning the Mic-in jack as an output terminal for woof and center sound effects, the line-out jack as an output terminal for surround sound effects, and the build-in speakers as an output for front sound effects.

7. The method according to claim 6, wherein the sound effect mode is set by using a control panel of the notebook computer.

8. The method according to claim 6, wherein the sound effect mode is set by using an application program under an operation system in the notebook computer.

9. The method according to claim 6, wherein the line-out jack supports an auto-detection function to disable the build-in speakers.

10. The method according to claim 6, further comprising the step of:

disabling the build-in speakers and assigning a first pair of external speakers as output devices for stereo sound effects when the sound effect mode is a stereo mode and the first pair of external speakers are connected to the line-out port.

11. The method according to claim 6, wherein the Mic-in jack supports an auto-detection function to determine a type of an inserted sound effect device to disable the build-in speakers.

12. The method according to claim 6, further comprising the step of:

disabling the build-in speakers, assigning a first pair of external speakers as output devices for surround sound effects, and assigning a second pair of external speakers as output devices for front sound effects when the sound effect mode is a 4-channel mode, the first pair of external speakers are connected to the line-out port, and the second pair of external speakers are connected to the Mic-in port.

13. The method according to claim 6, further comprising the step of:

assigning the build-in speakers as output devices for front sound effects, a first pair of external speakers as output devices for surround sound effects, and a second pair of external speakers as output devices for woof and center sound effects when the sound effect mode is a 5.1-channel mode, the first pair of external speakers are connected to the line-out port, and the second pair of external speakers are connected to the Mic-in port.

* * * * *